(12) United States Patent
Wang et al.

(10) Patent No.: US 11,337,343 B2
(45) Date of Patent: May 17, 2022

(54) MOUNT ASSEMBLY FOR ADD-IN CARD, ELECTRONIC DEVICE, AND CHASSIS

(71) Applicant: Wistron Corp., New Taipei (TW)

(72) Inventors: Jun-Hao Wang, New Taipei (TW); Tai-Hsun Wu, New Taipei (TW); Li Shu Chen, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 16/775,413

(22) Filed: Jan. 29, 2020

(65) Prior Publication Data

US 2021/0068317 A1 Mar. 4, 2021

(30) Foreign Application Priority Data

Sep. 3, 2019 (CN) .......................... 201910837189.2

(51) Int. Cl.
*H05K 9/00* (2006.01)
*G06F 1/16* (2006.01)
*F16M 13/02* (2006.01)

(52) U.S. Cl.
CPC ........... *H05K 9/0007* (2013.01); *F16M 13/02* (2013.01); *G06F 1/1613* (2013.01)

(58) Field of Classification Search
CPC .................................................... H05K 13/00
See application file for complete search history.

(56) References Cited

U.S. PATENT DOCUMENTS

| 9,959,909 | B1* | 5/2018 | Chang | .................. G11B 33/124 |
| 2015/0327414 | A1* | 11/2015 | Jau | ....................... G11B 33/124 |
| | | | | 206/701 |
| 2016/0179131 | A1 | 6/2016 | Chen et al. | |

FOREIGN PATENT DOCUMENTS

| TW | 201210450 A | 3/2012 |
| TW | M510035 U | 10/2015 |
| TW | I604295 B | 11/2017 |
| TW | M554632 U | 1/2018 |

OTHER PUBLICATIONS

Taiwan Patent Office, "Office Action", dated May 12, 2020, Taiwan.

* cited by examiner

*Primary Examiner* — Jerry Wu
(74) *Attorney, Agent, or Firm* — Locke Lord LLP; Tim Tingkang Xia, Esq.

(57) ABSTRACT

The disclosure relates to a mount assembly for add-in card including a base plate, a tray, and a handle. The tray is slidably disposed on the base plate. The handle includes a pivot portion and a tray installation portion. The pivot portion is pivotally disposed on the base plate. The tray installation portion is pivotally and slidably disposed on the tray. In addition, the disclosure also relates to an electronic device having the mount assembly and a chassis for the electronic device.

20 Claims, 14 Drawing Sheets

MOUNT ASSEMBLY FOR ADD-IN CARD, ELECTRONIC DEVICE, AND CHASSIS

CROSS-REFERENCE TO RELATED APPLICATIONS

This non-provisional application claims priority under 35 U.S.C. § 119(a) on Patent Application No(s). 201910837189.2 filed in China on Sep. 3, 2019, the entire contents of which are hereby incorporated by reference.

TECHNICAL FIELD

The disclosure relates to a mount assembly, an electronic device, and a chassis, more particularly to a mount assembly for add-in card, an electronic device having the mount assembly, and a chassis for the electronic device.

BACKGROUND

With the development of technology, electronic devices, such as computers or computer systems that can provide various cloud services, often require function expansion or improvement of existing functions. Taking server as an example, according to market demand, most of the servers are equipped with additional function module to expand or add more function to the server. The function module can be in a form of an add-in card capable of providing some specific functions to the server. In order to upgrade the function or for the purpose of maintenance, the add-in card is replaceable so that the existing add-in card can be replaced by new or another more powerful add-in card.

It is well known that the internal arrangement of server is in a very compact manner in order to efficiently utilize the internal space. Therefore, the room in the server for the add-in card is very limited. In some cases, the add-in card is arranged in a narrow space between a hard disk module and a fan module, however, the narrow space is almost as wide as the add-in card, thus it is not sufficient to easily perform the installation and removal of the add-in card, thereby causing inconveniences and difficulties to the user. It is understood that such problem not only occurs in the conventional server but also occurs in any other cases that an electrical component or device is required to be installed into or removed from a very limited space.

SUMMARY

One embodiment of the disclosure provides a mount assembly for add-in card. The mount assembly includes a base plate, a tray, and a handle. The tray is slidably disposed on the base plate. The handle includes a pivot portion and a tray installation portion. The pivot portion is pivotally disposed on the base plate. The tray installation portion is pivotally and slidably disposed on the tray.

Another embodiment of the disclosure provides an electronic device including a chassis and a mount assembly. The chassis includes a bearing plate, a back panel, a first cage, and a second cage. The back panel, the first cage, and the second cage are disposed on the bearing plate. The back panel is located at one side of the first cage. The second cage is located at a side of the back panel opposite to the first cage and spaced apart from the back panel. The mount assembly includes a base plate, a tray, and a handle. The base plate is detachably disposed on the bearing plate of the chassis and located between the second cage and the back panel. The tray is slidably disposed on the base plate so as to be moved closer to or away from the back panel. The handle includes a pivot portion and a tray installation portion. The pivot portion is pivotally disposed on the base plate. The tray installation portion is pivotally and slidably disposed on the tray.

Another embodiment of the disclosure provides a chassis for an electronic device. The chassis includes a bearing plate, a back panel, a first cage, and a second cage. The back panel, the first cage, and the second cage are disposed on the bearing plate. The back panel is located at a side of the first cage. The second cage is located at a side of the back panel opposite to the first cage and is spaced apart from the back panel. The bearing plate has at least one mount assembly guiding structure and at least one mount assembly screw hole. The at least one mount assembly guiding structure and the at least one mount assembly screw hole are located between the back panel and the second cage.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
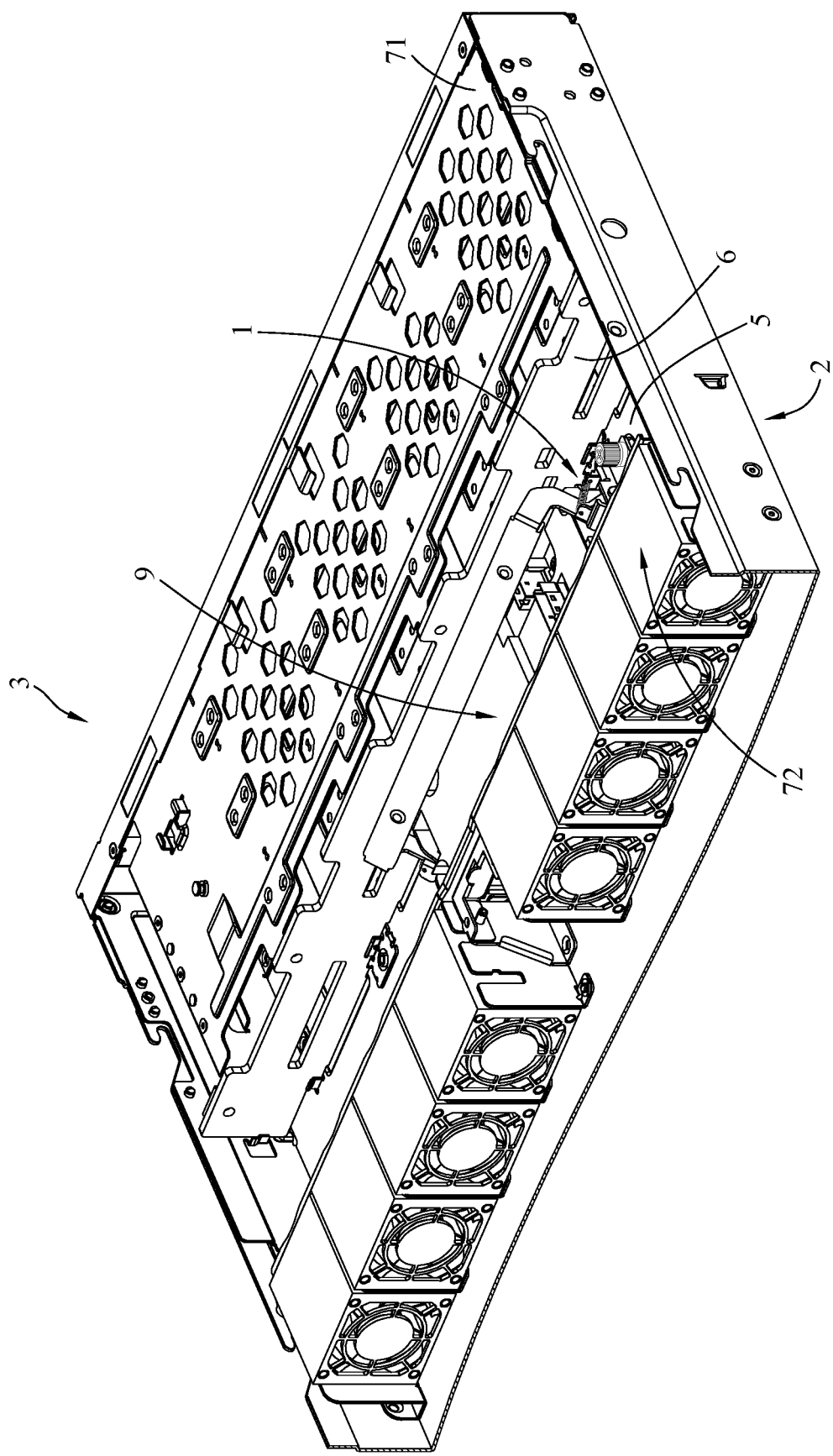
FIG. 1 is an assembly perspective view of a mount assembly for add-in card being disposed on a chassis according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details.

In addition, for the purpose of simple illustration and clarity, well-known structures and devices are drawn schematically. And the size or ratio of the features in the drawings of the present disclosure may be exaggerated for illustrative purposes, but the present disclosure is not limited thereto. Note that the actual size and designs of the product manufactured based on teaching and suggestion of the present disclosure may also be properly modified according to any actual requirement.

In addition, the terms, such as "end", "portion", "part", "area" and the like may be used in the following to describe specific components and structures or specific features thereon or therebetween, but are not intended to limit these components and structures. Also, term "and/or" may be used in the following to indicate a combination comprising one of listed elements and all of the listed elements. Further, in the following, terms, such as "substantially", "approximately" or "about" may be used in the following to cover or indicate acceptable deviation caused by manufacturing tolerances or measurement process but would not affect in achieving the desired purpose.

Furthermore, the terms used in the disclosure, including technical and scientific terms, have their ordinary meanings that can be understood by those skilled in the art. Unless specifically defined, these terms are not to be construed as too idealistic or formal meanings.

Figure 2:
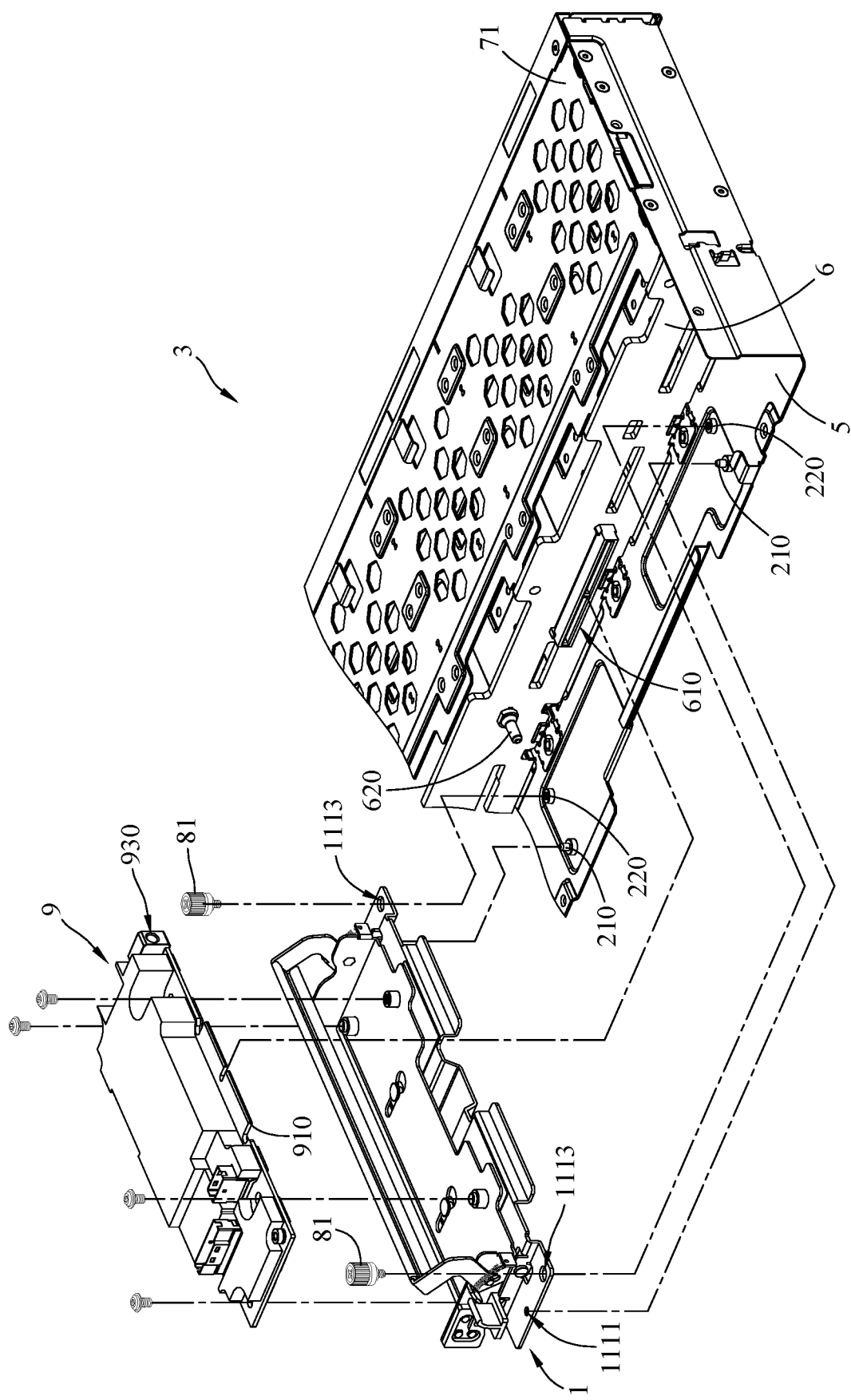
FIG. 2 is an exploded perspective view of the mount assembly and the chassis in FIG. 1.

Firstly, one embodiment of the disclosure provides a mount assembly 1 for add-in card and a chassis 2 applicable for an electronic device 3, referring to FIGS. 1-2, FIG. 1 is an assembly perspective view of the mount assembly 1 being disposed on the chassis 2 according to one embodiment of the disclosure, and FIG. 2 is an exploded perspective view of the mount assembly 1 and the chassis 2. The electronic device 3 is, for example, but not limited to a server. For the purpose of illustrating the spirit of the disclosure, only part of the electronic device 3 is shown in the drawings. For example, only the chassis 2 and the mount assembly 1 thereon may be shown in the drawings. Herein, the chassis 2 can be considered as a base part, bearing casing or other part of the electronic device 3. In this or some embodiments, the chassis 2 can be, but is not limited to, disposed on another larger housing or combined with another tray (not shown) to form a bearing base for bearing and supporting various required components of the electronic device 3. In addition, for the purpose of simple illustration and clarity, some components or unnecessary details on the chassis 2, such as hard drives and cables, were simplified or omitted from the drawings.

In this embodiment and some other embodiments, the chassis 2 includes a bearing plate 5, a back panel 6, a first cage 71, and a second cage 72. The back panel 6, the first cage 71, and the second cage 72 are all disposed on the bearing plate 5, and the back panel 6 is located at a side of the first cage 71. The first cage 71 is configured to accommodate at least one electrical component or device (not shown) electrically connected to the back panel 6. For example, the first cage 71 is able to accommodate at least one hard disk drive; in such a case, the back panel 6 is, for example, a HDD back panel capable of being connected to the hard disk drive, the first cage 71 can be considered as a HDD cage, and the first cage 71 and the HDDs therein can together form a HDD module, but the disclosure is not limited to the design of the first cage 71 and the type or quantity of the electrical component or device that can be installed in the first cage 71. The second cage 72 is located at a side of the chassis 2 away from the first cage 71, more specifically, the second cage 72 is located at a side of the back panel 6 opposite to the first cage 71 and is spaced apart from the back panel 6 by a specific distance suitable for accommodating the mount assembly 1. The second cage 72 is able to accommodate at least one electrical component or device, such as fan (not labeled); in such a case, the second cage 72 can be considered as a fan module cage, and the second cage 72 and the fans therein can together form a fan module, but the disclosure is not limited to the design of the second cage 72 and the type or quantity of the electrical component or device that can be installed in the second cage 72.

The mount assembly 1 is detachably disposed on the chassis 2; particularly, the mount assembly 1 is detachably and movably disposed in the narrow space between the first cage 71 and the second cage 72. As shown in FIG. 2, in this embodiment or some other embodiments, the bearing plate 5 of the chassis 2 has at least one mount assembly guiding structure 210 and at least one mount assembly screw hole 220, where each of the opposite sides of the bearing plate 5 has one mount assembly guiding structure 210 and one mount assembly screw hole 220. These mount assembly guiding structures 210 and mount assembly screw holes 220 are located between the back panel 6 and the second cage 72. The mount assembly 1 has at least one installation guide structure 1111 and at least one installation hole 1113, where each of the opposite sides of the mount assembly 1 has one installation guide structure 1111 and one installation hole 1113. The installation guide structures 1111 and the installation holes 1113 respectively correspond to the mount assembly guiding structures 210 and the mount assembly screw holes 220 of the bearing plate 5 of the chassis 2.

The mount assembly guiding structure 210 is, for example, a protrusion, and the installation guide structure 1111 is, for example, a through hole, but the disclosure is not limited thereto; for example, in some other embodiments, the mount assembly guiding structure may be a through hole, and the installation guide structure may be a protrusion protruding toward the chassis; alternatively, in some embodiments, the mount assembly guiding structure of the chassis and the installation guide structure of the mount assembly may be a protrusion and a mating recess or through hole that are in other shapes.

As the dotted lines shown in FIG. 2, during the installation of the mount assembly 1 to the chassis 2, the mount assembly guiding structures 210 of the chassis 2 can be inserted into the installation guide structures 1111 of the mount assembly 1 so as to guide the mount assembly 1 to the desired position, meanwhile, the installation holes 1113 of the mount assembly 1 correspond to the mount assembly screw holes 220 of the chassis 2, and fasteners 81 can be disposed through the installation holes 1113 and screwed into the mount assembly screw holes 220 and thus fixing the mount assembly 1 to the chassis 2. The fastener 81 is, for example, but not limited to a thumb screw or other suitable fasteners.

When the mount assembly 1 is installed on the chassis 2, as shown in FIG. 1, the back panel 6 is located at one side of the mount assembly 1, the first cage 71 is located at a side of the back panel 6 opposite to the mount assembly 1, and the second cage 72 is located at another side of the mount assembly 1 opposite to the back panel 6; that is, the mount assembly 1 is detachably and movably located in the narrow space between the back panel 6 and the second cage 72. Therefore, in some embodiments that the electronic device 3 is a server, the mount assembly 1 is configured to be detachably and movably disposed in the narrow space between the HDD module and fan module. Note that the electronic device 3 is not limited to be a server or the server shown in the drawings; that is, the disclosure is not limited to be applicable to the field of server. For example, in some other embodiments, the electronic device of the disclosure may be another type of server or computer host.

In addition, in this embodiment and some other embodiments, the mount assembly 1 is able to accommodate one or more electrical components or device required by the electronic device 3, such as an add-in card 9 shown in FIGS. 1 and 2. Therefore, the add-in card 9 can be detachably installed to the chassis 2 via the mount assembly 1. The mount assembly 1 and the add-in card 9 thereon can together form a detachably function module. In some embodiments that the electronic device 3 having the chassis 2 and the mount assembly 1 is a server, the add-in card 9 accommodated in the mount assembly 1 is, for example, a function card that can provide, for example, signal communication function to system board or server mainboard, but the disclosure is not limited to the type and size of the add-in card that the mount assembly is capable of accommodating with and the function that the add-in card can provide, as such can be modified, changed or adjusted according to actual requirements.

In more detail, as shown in FIG. 2, in this embodiment or some other embodiments, the back panel 6 has at least one add-in card slot 610 located at one side thereof facing toward the mount assembly 1, and the add-in card 9 has gold fingers 910. The gold fingers 910 are adapted to be electrically connected to the add-in card slot 610 on the back panel 6. However, the disclosure is not limited to the designs of the gold fingers 910 of the add-in card 9 and the add-in card slot 610 of the back panel 6. It is understood that any other suitable connectors that can electrically connect the add-in card to the back panel can be employed.

In addition, in this embodiment or some other embodiments, the back panel 6 further has at least one guide post 620 located at the side thereof facing toward the mount assembly 1, and the add-in card 9 has at least one guide hole 930. During the insertion of the gold fingers 910 of the add-in card 9 into the add-in card slot 610 of the back panel 6, the guide post 620 of the back panel 6 is inserted into the guide hole 930 of the add-in card 9 so as to guide the add-in card 9 to move in a predetermined direction.

Figure 5:
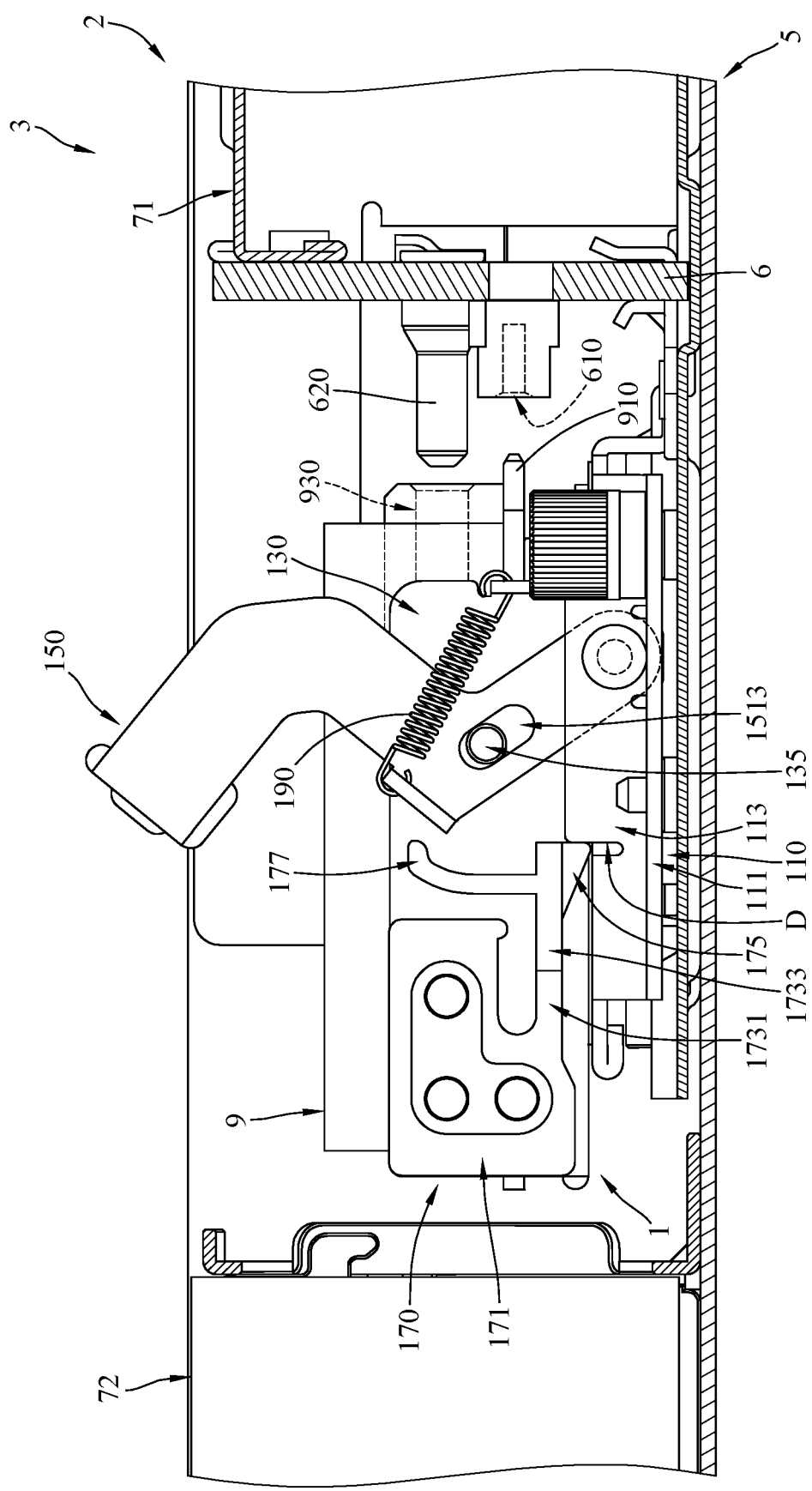
FIG. 5 is a cross sectional side view of the mount assembly in FIG. 1.
Figure 6A:
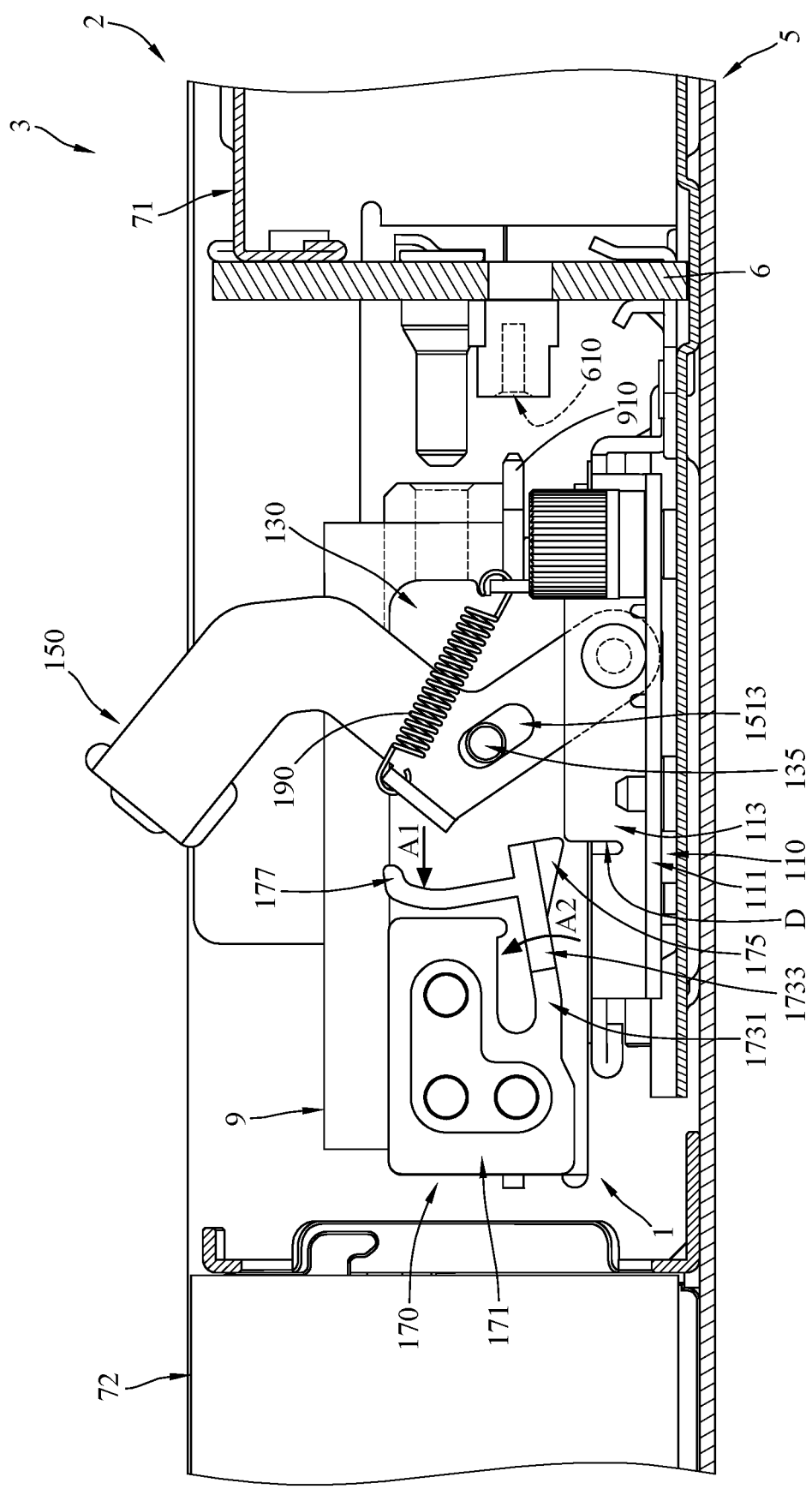
FIGS. 6A-6B show the operation of the mount assembly in FIG. 1.
Figure 6B:
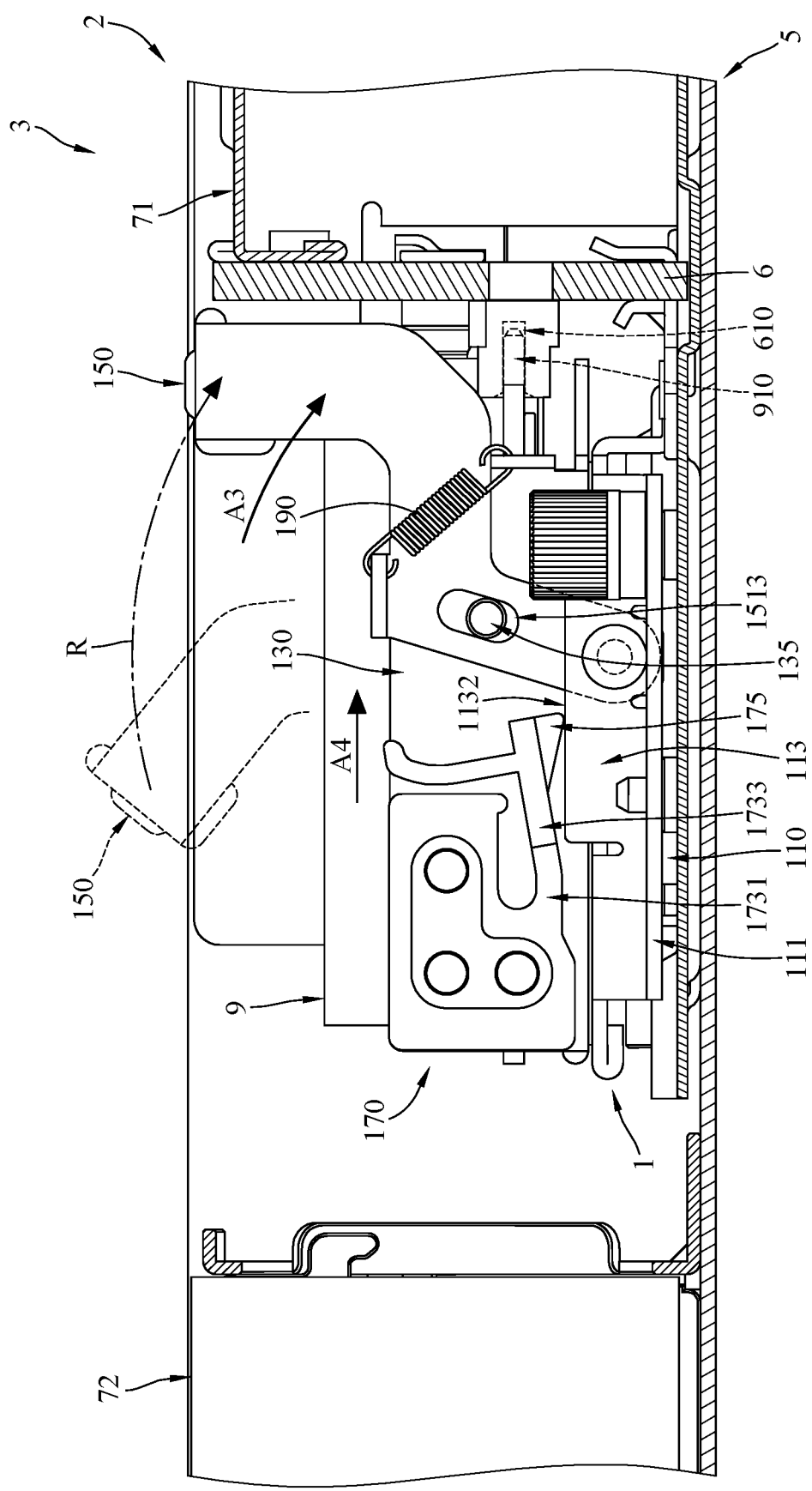
Figure 7:
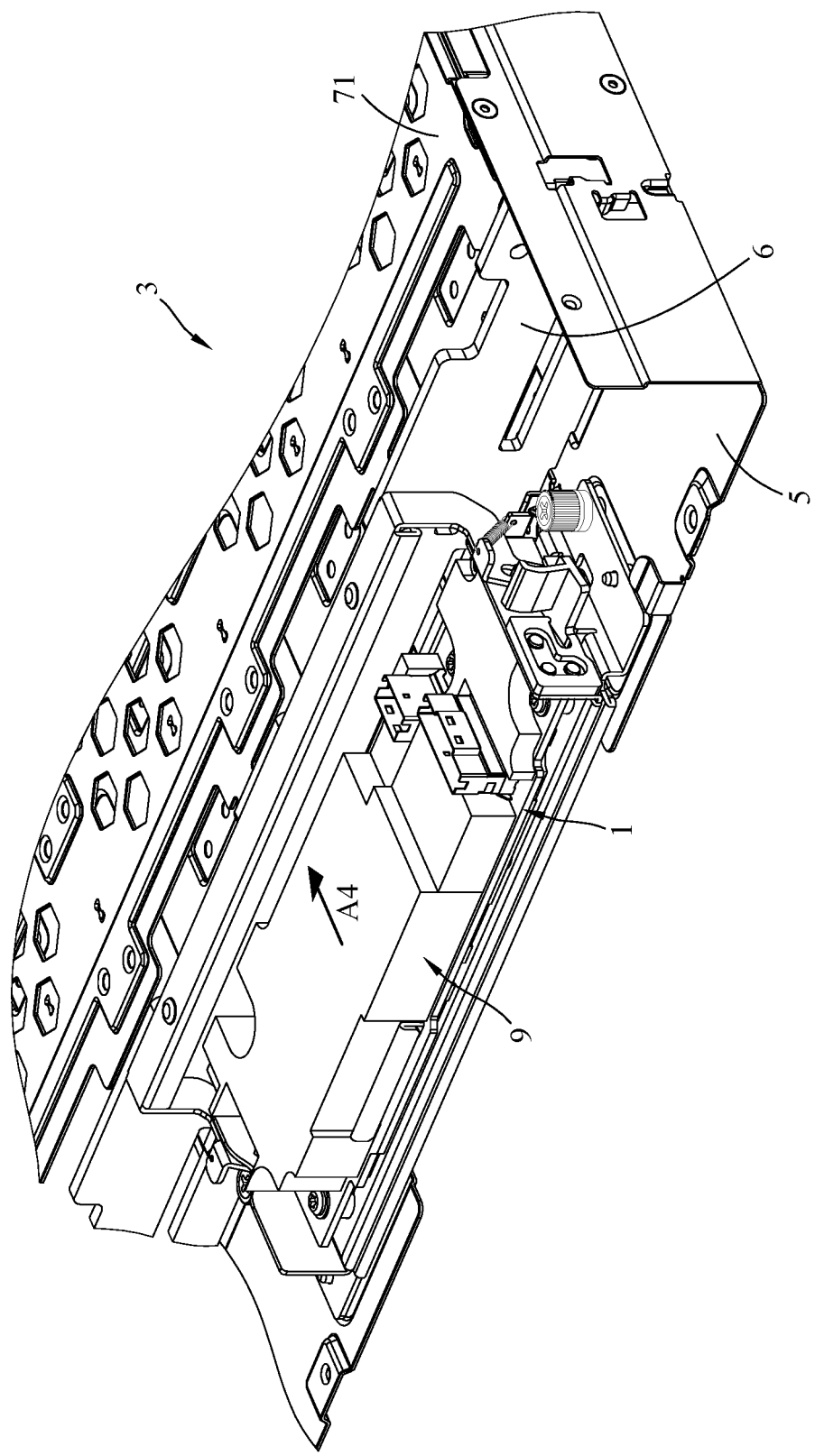
FIG. 7 is a partial perspective view of the mount assembly in FIG. 6B when the mount assembly has been switched to a connected status.

In this embodiment and some other embodiments, the mount assembly 1 is movably located in the narrow space between the back panel 6 and the second cage 72 so as to have a disconnected status (as shown in FIG. 1 or FIG. 5 illustrated in later paragraphs) and a connected status (as shown in FIG. 6B or FIG. 7 illustrated in later paragraphs). When the mount assembly 1 is assembled to the chassis 2, the gold fingers 910 of the add-in card 9 on the mount assembly 1 can be engaged to or disengaged from the add-in card slot 610 on the back panel 6 by switching the status of the mount assembly 1. The structural details and operation of the mount assembly 1 will be illustrated in the later paragraphs.

Figure 3:
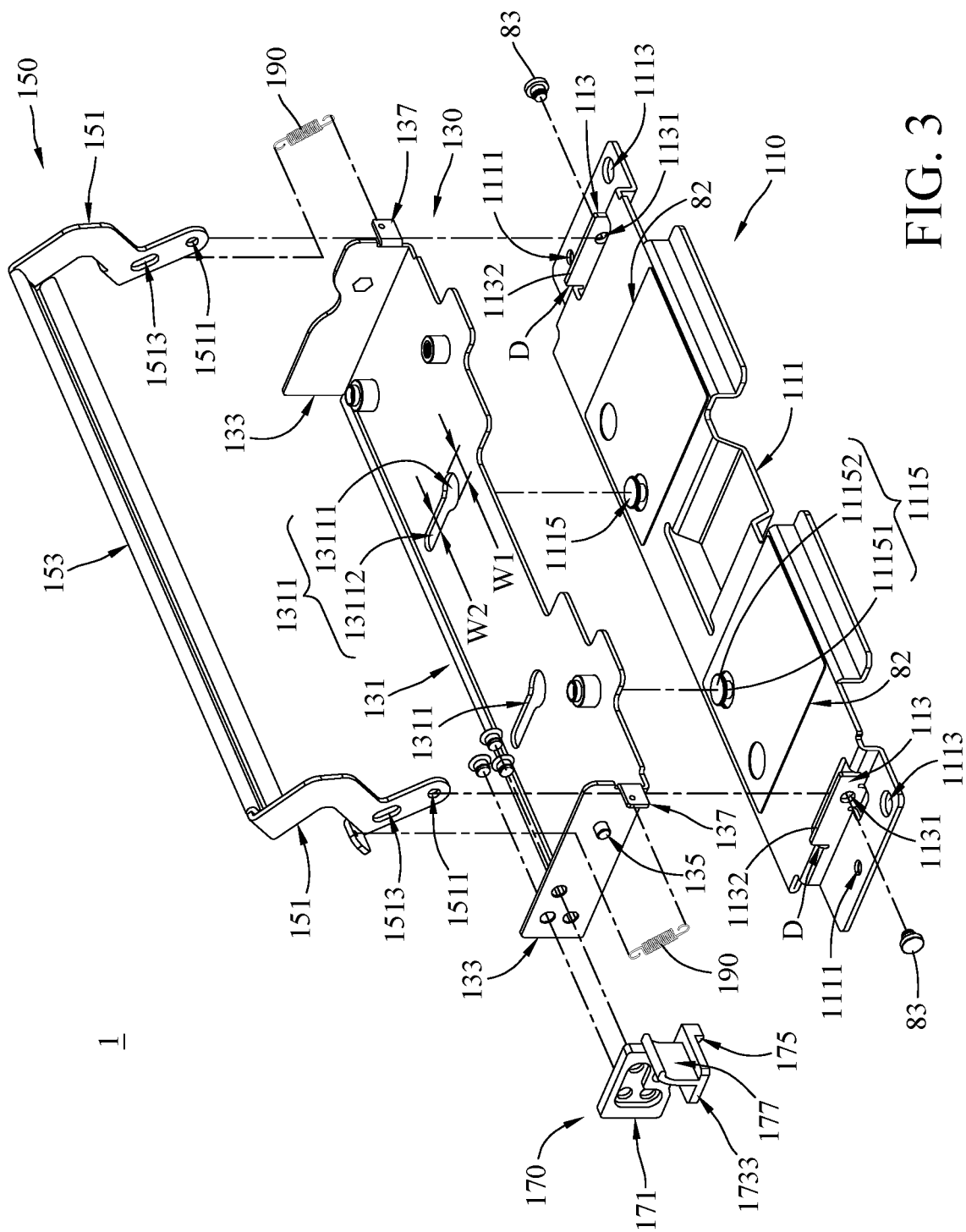
FIGS. 3-4 are exploded perspective views of the mount assembly in FIG. 2, taken from different viewpoints.
Figure 4:
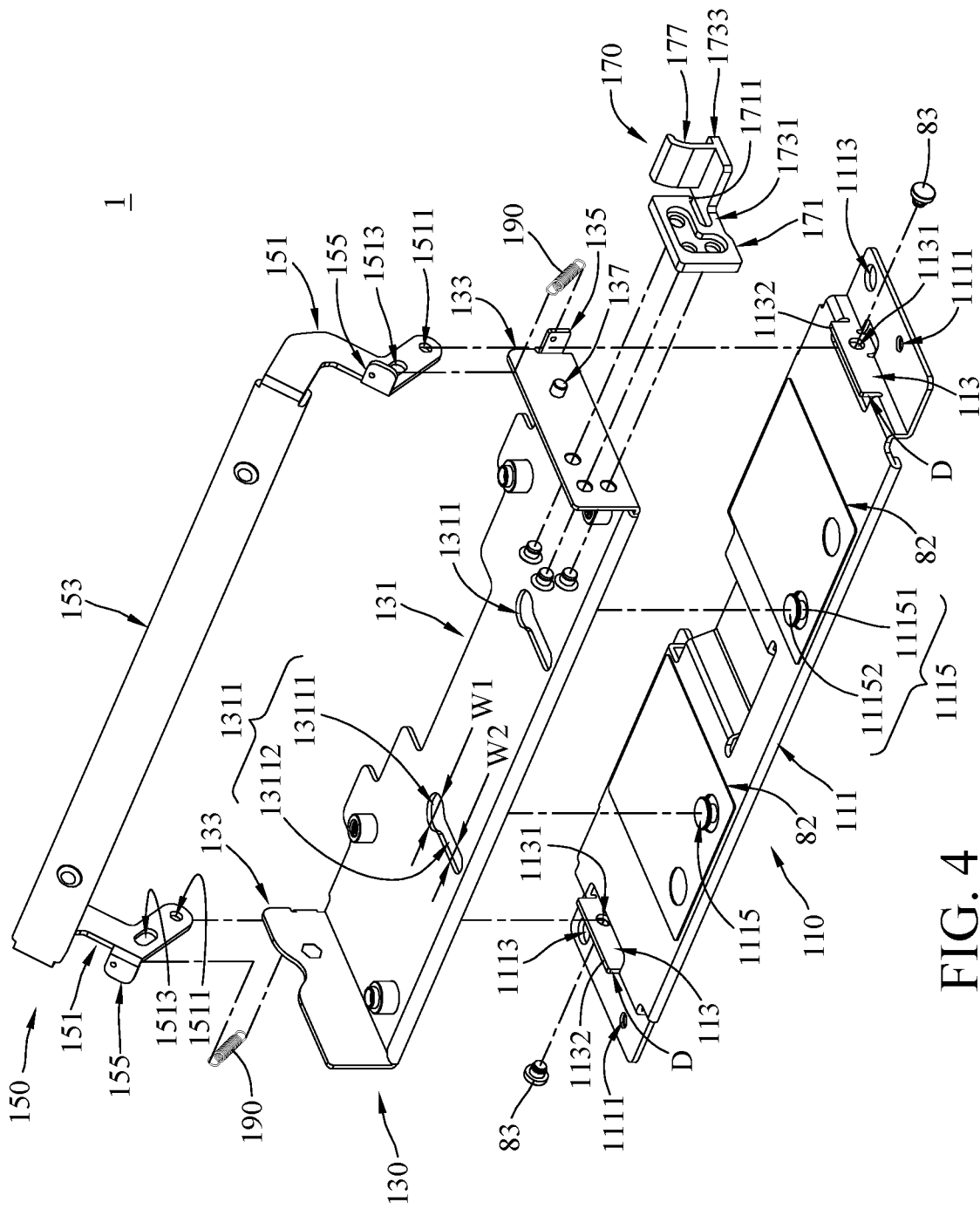

Referring to FIGS. 3-4, FIGS. 3-4 are exploded perspective views of the mount assembly 1 in FIG. 2, taken from different viewpoints. In this embodiment and some other embodiments, the mount assembly 1 includes a base plate 110, a tray 130, a handle 150, at least one positioning structure 170, and at least one elastic biasing component 190.

The base plate 110 is, for example, but not limited to, made of metal. The base plate 110 includes a main body part 111 and two sidewall parts 113. The installation guide structures 1111 and the installation holes 1113 are located on the main body part 111, thus, the main body part 111 of the base plate 110 can be positioned on the chassis 2 by inserting the mount assembly guiding structures 210 of the chassis 2 into the installation guide structures 1111 and can be fixed to the chassis 2 by screwing the fasteners 81 into the installation holes 1113 and the mount assembly screw holes 220 of the chassis 2.

The sidewall part 113 extends from a side of the main body part 111 facing away from the chassis 2 in a direction away from the chassis 2, thus, a step D is formed between the sidewall part 113 and the base plate 110. To the main body part 111, the sidewall parts 113 are located opposite to each other and are respectively located adjacent to two opposite sides of the main body part 111, and the sidewall parts 113 are located closer to the central part of the base plate 110 than the installation guide structures 1111 and the installation holes 1113 on the main body part 111. The sidewall parts 113 and the base plate 110 together form a space therebetween for accommodating the tray 130.

In more detail, the sidewall parts 113 each have a handle pivot portion 1131 for the handle 150 to be pivotally connected to the sidewall parts 113. The handle pivot portion 1131 is, for example, but not limited to a through hole.

In addition, the main body part 111 has at least one first guide structure 1115. In FIG. 3, in this embodiment, the main body part 111 have two first guide structures 1115 spaced apart from each other. The two first guide structures 1115 are located between the sidewall parts 113 and protrude from a side of the main body part 111 facing away from the chassis 2 in a direction away from the chassis 2. In this embodiment, the first guide structure 1115 is, for example, but not limited to a positioning pin, and the positioning pin is, for example, in a T-shaped pin. As shown in FIG. 3, the first guide structure 1115 has a neck portion 11151 and a head portion 11152, the head portion 11152 is connected to the main body part 111 via the neck portion 11151, and an outer diameter of the head portion 11152 is larger than an outer diameter of the neck portion 11151.

The tray 130 is made of, for example, but not limited to, metal, and the tray 130 is slidably disposed on the main body part 111 of the base plate 110 and located between the sidewall parts 113 of the base plate 110. More specifically, the tray 130 includes a bottom plate 131 and two side plates 133, the side plates 133 are respectively connected to two opposite sides of the bottom plate 131, and the side plates 133 and the bottom plate 131 together form a space for accommodating the add-in card 9. The add-in card 9 is detachably disposed on the bottom plate 131 of the tray 130, as shown in FIG. 2, the add-in card 9 can be fixed to the bottom plate 131 of the tray 130 via at least one fastener (not labeled), but the disclosure is not limited to how the add-in card 9 is fixed on the tray 130.

In addition, the bottom plate 131 has at least one second guide structure 1311. As shown in FIG. 3, in this embodiment, the bottom plate 131 has two second guide structures 1311 spaced apart from each other, and the two second guide structures 1311 are located between the side plates 133. The second guide structure 1311 is, for example, but not limited to a sliding slot. The first guide structures 1115 of the base plate 110 are respectively disposed through the second guide structures 1311 of the bottom plate 131 of the tray 130, such that the tray 130 is limited to be moved along on the base plate 110 back and forward in a predetermined path, where the predetermined path is substantially parallel to the extension direction of the second guide structure 1311.

In more detail, in this embodiment, the second guide structures 1311 of the tray 130 each have a first portion 13111 and a second portion 13112 connected to each other. The first portion 13111 is, for example, a through hole in a circle-like shape, the second portion 13112 is, for example, a slot, and a width W1 of the first portion 13111 is larger than a width W2 of the second portion 13112. In comparison with the first guide structure 1115 in T shape on the base plate 110, the outer diameter of the head portion 11152 of the first guide structure 1115 is smaller than the width W1 of the first portion 13111 of the second guide structure 1311 on the tray 130 but larger than the width W2 of the second portion 13112, and the outer diameter of the neck portion 11151 of the first guide structure 1115 is slightly smaller than the width W2 of the second portion 13112. In such a configuration, the head portion 11152 of the first guide structure 1115 is allowed to pass through the first portion 13111 of the second guide structure 1311, and the neck portion 11151 of the first guide structure 1115 is allowed to slide along the first portion 13111 and the second portion 13112 of the second guide structure 1311. When the neck portion 11151 of the first guide structure 1115 is located in the second portion 13112 of the second guide structure 1311, the movement of the bottom plate 131 of the tray 130 is limited by the head portion 11152 of the first guide structure 1115 and the main body part 111 of the base plate 110, such that the tray 130 is prevented from being moved away from the base plate 110.

Note that the disclosure is not limited to the designs of the second guide structure 1311 of the tray 130 and the first guide structure 1115 of the base plate 110; in some embodiments, the first guide structure of the base plate may only remain the neck portion 11151, and the second guide structure of the tray may only remain the second portion 13112 in form of slot. It is understood that any other suitable designs that can limit the tray to move in a specific direction on the base plate can be employed as the first guide structure and the second guide structure of the disclosure; for example, in some other embodiments, the first guide structure of the base plate may be a slot, and the second guide structure of the tray may be a mating pin protruding toward the base plate; or, in one alternative embodiment, the guide structures of the base plate and the tray may be a protrusion and a mating slot that are in other shapes.

In addition, the tray 130 further includes at least one handle installation portion 135, as shown in the FIG. 3, in this embodiment, there are two handle installation portions 135 respectively disposed on the side plates 133 of the tray 130. The handle installation portion 135 is, for example, but not limited to a protrusion protruding from the surface of one of the side plate 133 facing away from the other side plate 133, and is configured for the installation of the handle 150.

The handle 150 may be made of metal or plastic, but the disclosure is not limited thereto. In this embodiment, the handle 150 may include two arm parts 151 and a grip part 153, wherein one of the arm parts 151 is connected to the other arm part 151 via the grip part 153, and the grip part 153 is shaped and sized to be easily held in a person's hand and allows the person to operate the handle 150.

The arm parts 151 may each have a pivot portion 1511 and a tray installation portion 1513. More specifically, the pivot portion 1511 is, for example, but not limited to a through hole, and located at one end of the arm part 151 away from the grip part 153; and the tray installation portion 1513 is, for example, but not limited to a sliding slot, and located closer to the grip part 153 than the pivot portion 1511.

The installation of the handle 150 can be implemented by the following steps: placing the arm parts 151 at the inner sides of the sidewall parts 113 of the base plate 110 and outer sides of the side plates 133 of the tray 13; aligning the pivot portions 1511 of the arm parts 151 with the handle pivot portions 1131 of the sidewall parts 113; disposing the handle installation portions 135 of the side plates 133 through the tray installation portions 1513 of the arm parts 151; disposing the fasteners 83 through the handle pivot portions 1131 and the pivot portions 1511 to pivotally fix the arm parts 151 of the handle 150 on the sidewall parts 113 of the base plate 110. Note that the fastener 83 is, for example, but not limited to a rivet or any other suitable fasteners.

As such, the handle 150 is pivotable relative to the base plate 110 along a pivoting path R (as shown in FIG. 6B illustrated in later paragraphs) about the pivot portions 1511 taken as a pivot center, such that the handle 150 can be switched to an opened position (as shown in FIG. 1 or FIG. 5 illustrated in later paragraphs) or a closed position (as shown in FIG. 6B or FIG. 7 illustrated in later paragraphs). The pivoting path R indicates path of portion or the whole of the handle 150 during the pivoting movement of the handle 150. Also, during the pivoting movement of the handle 150 with respect to the base plate 110 (i.e., during the movement of the handle 150 between its opened position and closed position), the tray installation portions 1513 on the arm parts 151 of the handle 150 push the handle installation portions 135 on the side plates 133 of the tray 130 so as to force the tray 130 to slide back and forward along the base plate 110 in a predetermined direction. That is, the handle 150 moving along the pivoting path R with respect to the base plate 110 can trigger the slide movement of the tray 130 with respect to the base plate 110.

Note that the disclosure is not limited to the way that the handle is pivotally connected to the base plate, any other suitable means that can pivotally fix the handle onto the base plate can be employed; for example, in some other embodiments, the pivot portion of the handle and the handle pivot portion of the base plate may be a convex and a mating concave that can be directly pivotally connected to each other, in such a case, the fasteners 83 may be omitted.

In addition, the disclosure is not limited to the way that the handle is installed on the tray, any other suitable designs that can make the handle pivotally and slidably disposed on the tray can be employed; for example, in some other embodiments, the tray installation portion of the handle may be a protrusion, and the handle installation portion of the tray may be a sliding slot, or, in one alternative embodiment, the tray installation portion of the handle and the handle installation portion of the tray may be a protrusion and a mating slot that are in other shapes.

In this embodiment or some other embodiments, the elastic biasing component 190 is provided so as to exert force on the handle 150 for pivoting the handle 150 with respect to the base plate 110 and sliding the tray 130 with respect to the base plate 110. More specifically, in FIG. 3, the tray 130 may further include two biasing-component installation portions 137, the biasing-component installation portions 137 are respectively disposed on the two side plates 133. To one of the side plates 133, the biasing-component installation portion 137 extends from one side of the side plate 133 toward in a direction away from the other side plate 133. The handle 150 may further include two biasing-component installation portions 155, the biasing-component installation portions 155 are respectively disposed on the two arm parts 151. To one of the arm parts 151, the biasing-component installation portion 155 extends from one side of the arm part 151 toward in a direction away from the other arm part 151. The quantity of the elastic biasing components 190 is not limited to be two, and the elastic biasing component 190 is, for example, but not limited to an extension spring having two opposite ends respectively connected to the biasing-component installation portion 137 of the tray 130 and the biasing-component installation portion 155 of the handle 150. In such an arrangement, the elastic biasing component 190 is able to exert force to the handle 150 for returning the handle 150 back to the closed position (as shown in FIG. 6B or FIG. 7 illustrated in later paragraphs) and thereby sliding the tray 130 with respect to the base plate 110.

However, the disclosure is not limited to the form of the elastic biasing component 190 and the way of installing the same, any other suitable means that can force the handle to pivot to the closed position may be employed as the elastic biasing component of the disclosure; for example, in some other embodiments, the elastic biasing component may be a torsion spring disposed between the handle and the base plate or may be other suitable elastic components.

In addition, in this embodiment, there may be at least one spacer 82 provided between the base plate 110 and the tray 130. The spacer 82 can be fixed on the surface of the base plate 110 facing the tray 130 and/or the surface of the tray 130 facing the base plate 110 via any other suitable manners, such as adhesive. The spacer 82 is, for example, but not limited to made of Mylar or other materials having high resistance to wear and low friction coefficient. The spacer 82 helps to reduce frictional resistance between the tray 130 and the base plate 110 as the tray 130 slides on the base plate 110. However, the spacer 82 is optional, and the disclosure is not limited thereto.

The quantity of the positioning structures 170 may be two. The positioning structures 170 can be respectively fixed on the outer sides of the side plates 133 of the tray 130 via at least one screw, adhesive or any other suitable manners. In addition, the positioning structure 170 may be, but not limited to made of a single piece. In more detail, the positioning structure 170 may be made of, for example, plastic or other materials having resilience and elasticity and thus capable of springing back to its original shape.

In this embodiment, the positioning structures 170 may each have a fixed portion 171, an elastic connection portion 1731, a middle portion 1733, a stopper portion 175, and an actuating portion 177. More specifically, the fixed portion 171 may be fixed to the outer sides of the side plate 133 of the tray 130 via, for example, screw, adhesive, or any other suitable manners; the middle portion 1733 is connected to the fixed portion 171 via the elastic connection portion 1731 so as to be movably located at the outer side of the side plate 133 of the tray 130; and the elastic connection portion 1731 is resilient and elastic. Therefore, when a certain amount of external force is applied on the elastic connection portion 1731 or the middle portion 1733, the elastic connection portion 1731 can be deformed to cause the elastic connection portion 1731 and the middle portion 1733 to move relative to the fixed portion 171 and other components, such as the side plate 133 of the tray 130.

The stopper portion 175 and the actuating portion 177 respectively protrude from two opposite surfaces of the middle portion 1733, as shown in FIGS. 3 and 4, the stopper portion 175 protrudes from the surface of the middle portion 1733 facing toward the base plate 110 and extending toward the base plate 110, and the actuating portion 177 protrudes from the surface of the middle portion 1733 facing away from the base plate 110 and extending in a direction away from the base plate 110. By pushing the actuating portion 177 to apply force on the actuating portion 177, the elastic connection portion 1731 can be deformed in a way to cause the middle portion 1733 to move toward the fixed portion 171. Herein, in this embodiment, the positioning structure 170 further includes a stopper structure 1711, the stopper structure 1711 protrudes from a side of fixed portion 171 and located above the surface of the middle portion 1733 on which the actuating portion 177 is disposed, such that the stopper structure 1711 is able to contact the middle portion 1733 pivoted with respect to the fixed portion 171 so as to restrict the movement range of the middle portion 1733. According to this, the elastic connection portion 1731 is prevented from being overly deformed. In addition, it is understood that the stopper portion 175 on the middle portion 1733 will be moved away from the base plate 110 with the middle portion 1733 as the stopper structure 1711 is forced to move toward the middle portion 1733.

In this embodiment, the cooperation of the positioning structure 170 and the base plate 110 is able to keep the mount assembly 1 in the disconnected status. More specifically, further referring to FIG. 5 to see a cross sectional side view of the mount assembly 1 in FIG. 1, the step D exists between the side of the sidewall part 113 and the base plate 110, and the elastic connection portion 1731 of the positioning structure 170 in normal condition keeps the stopper portion 175 in a path will encounter the step D, therefore, the elastic potential energy stored in the elastic biasing component 190 stretched by the tray 130 and the handle 150 is not yet used to pivot the handle 150 back to the closed position but to keep the stopper portion 175 in pressing against the step D so as to restrict the further movement of the tray 130 toward the back panel 6. That is, the step D stops the positioning structure 170 so that the movement of the tray 130 moving further toward the back panel 6 is restricted, and the handle 150 is kept in the closed position by the handle installation portion 135 of the tray 130. As a result, the mount assembly 1 is kept in the disconnected status. At this moment, the gold fingers 910 of the add-in card 9 on the tray 130 are not yet inserted into the add-in card slot 610 on the back panel 6.

Then, the operation of the mount assembly 1 for inserting the gold fingers 910 of the add-in card 9 in the narrow space between the back panel 6 and the second cage 72 into the add-in card slot 610 on the back panel 6 is described in the following paragraphs. Referring to FIGS. 6A-6B, FIGS. 6A-6B show the operation of the mount assembly 1 in FIG. 1.

Firstly, the actuating portion 177 of the positioning structure 170 is moved in, for example, a direction indicated by arrow A1, such that the actuating portion 177 forces the middle portion 1733 to move closer to the fixed portion 171 in, for example, a direction indicated by arrow A2. By doing so, the middle portion 1733 can be in a position allows the stopper portion 175 to move across the step D of the sidewall part 113 of the base plate 110.

At this moment, the stopper portion 175 of the positioning structure 170 is not stopped by the step D, such that the sliding movement of the tray 130 toward the back panel 6 is not restricted by the positioning structure 170. Therefore, the elastic potential energy stored in the elastic biasing component 190 now is able to pivot the handle 150 to the closed position in, for example, a direction indicated by arrow A3. During the pivoting movement of the handle 150 to the closed position, the mount assembly 1 is forced to move to the connected status, such that the tray 130 and the add-in card 9 thereon are forced to move toward the back panel 6 in, for example, a direction indicated by arrow A4. As a result, the gold fingers 910 of the add-in card 9 are inserted into the add-in card slot 610 of the back panel 6.

FIG. 7 is a partial perspective view of the mount assembly 1 in FIG. 6B when it is switched to the connected status. Referring to FIGS. 1 and 7, the mount assembly 1 is able to move the add-in card 9 thereon to the back panel 6 so as to implement the insertion of the gold fingers 910 of the add-in card 9 to the add-in card slot 610 of the back panel 6, even if the mount assembly 1 is located within a narrow space between the back panel 6 and the second cage 72.

In addition, in some embodiments, the elastic potential energy stored in the elastic biasing component 190 is sufficient to switch the mount assembly 1 to the connected status and securely insert the gold fingers 910 of the add-in card 9 into the add-in card slot 610 of the back panel 6; in other words, during the movement of the handle 150 from the opened position to the closed position, the amount of the elastic potential energy that the elastic biasing component 190 can store is sufficient to cause the handle 150 and the tray 130 to move and overcome the resistance resulted from the insertion of the gold fingers 910 to the add-in card slot 610. However, the disclosure is not limited to the strength of the elastic biasing component 190 and the elastic potential energy provided by the same. Note that the user is able to apply additional force to assist the handle 150 in moving toward the closed position for the purpose of achieving the electrical connection between the add-in card 9 and the back panel 6.

In addition, as shown in FIG. 6B, during the movement of the tray 130 sliding toward the back panel 6, the stopper portion 175 of the positioning structure 170 is slidably in contact with an upper edge 1132 of the sidewall part 113 of the base plate 110 and thus keeping the deformation of the elastic connection portion 1731 and storing elastic restoring energy. The upper edge 1132 indicates the edge of the sidewall part 113 away from the main body part 111.

On the contrary, disengaging the gold fingers 910 of the add-in card 9 from the add-in card slot 610 on the back panel 6 can be implemented by following the reversed steps illustrated in FIG. 6B, FIG. 6A and FIG. 5. Firstly, as shown in FIG. 6B, the handle 150 is forced to move toward the opened position in, for example, a direction opposite to arrow A3. In this step, the handle 150 stretches the elastic biasing component 190 so that the elastic biasing component 190 stores more elastic potential energy, and the handle 150 can move the tray installation portion 1513 so as to move the tray 130 and the add-in card 9 thereon away from the back panel 6, in, for example, a direction opposite to arrow A4. Accordingly, the gold fingers 910 of the add-in card 9 can be disengaged from the add-in card slot 610 on the back panel 6. Then, as the handle 150 pivots to the opened position, the stopper portion 175 of the positioning structure 170 crosses the step D, as shown in FIG. 6A to FIG. 5, the elastic restoring energy stored in the elastic connection portion 1731 is released to move the middle portion 1733 and the stopper portion 175 thereon to their original positions. As a result, the mount assembly 1 is kept in the disconnected status.

Furthermore, the fasteners 81 can be removed, such that the user is allowed to take the mount assembly 1 out of the chassis 2 by holding the handle 150. While the mount assembly 1 is lifted away from the chassis 2, the elastic biasing component 190 exerts force to keep the stopper portion 175 of the positioning structure 170 pressing against the step D of the base plate 110, such that the handle 150 is fixed in the current position and not allowed to freely pivot with respect to the tray 30, preventing the tray 130 and the add-in card 9 thereon from sliding with respect to the base plate 110. That is, when the mount assembly 1 is removed from the chassis 2, the relative motions among the base plate 110, the tray 130 and the handle 150 are prevented. In other words, the mount assembly 1 is kept in disconnected status after removed from the chassis 2.

In addition, the required displacement of the tray 130 with respect to the base plate 110 can be changed depending on the designs of the gold fingers 910 of the add-in card 9 and the add-in card slot 610 of the back panel 6. In some embodiments, during the displacement of the mount assembly 1 from the disconnected status to the connected status, the tray 130 may travel approximately 10 millimeters, but the disclosure is not limited thereto. Correspondingly, the length of the second guide structure 1311 on the tray 130 can be changed depending on the travel distance of the tray 130, which is to ensure that the first guide structure 1115 of the base plate 110 does not leave the second portion 13112 of the second guide structure 1311 having smaller width during the whole travel of the tray 130.

As discussed above, only one push of the positioning structure 170 is able to make the mount assembly 1 move in a narrow space between the back panel 6 and the second cage 72 and automatically switch to the connected status, completing the electrical connection between the add-in card 9 and the back panel 6; on the other hand, merely pivoting the handle 150 is able to make the mount assembly 1 to switch to the disconnected status and to disengage the add-in card 9 from the back panel 6; in addition, the positioning structure 170 is able to keep the mount assembly 1 in the disconnected status for the next operation. Accordingly, the mount assembly 1 of this embodiment is easy to use and can be used in a toolless manner so that the mount assembly 1 is suitable for the installation/removal of add-in card within a narrow space between modules (e.g., the hard disk drive module and the fan module).

Figure 8:
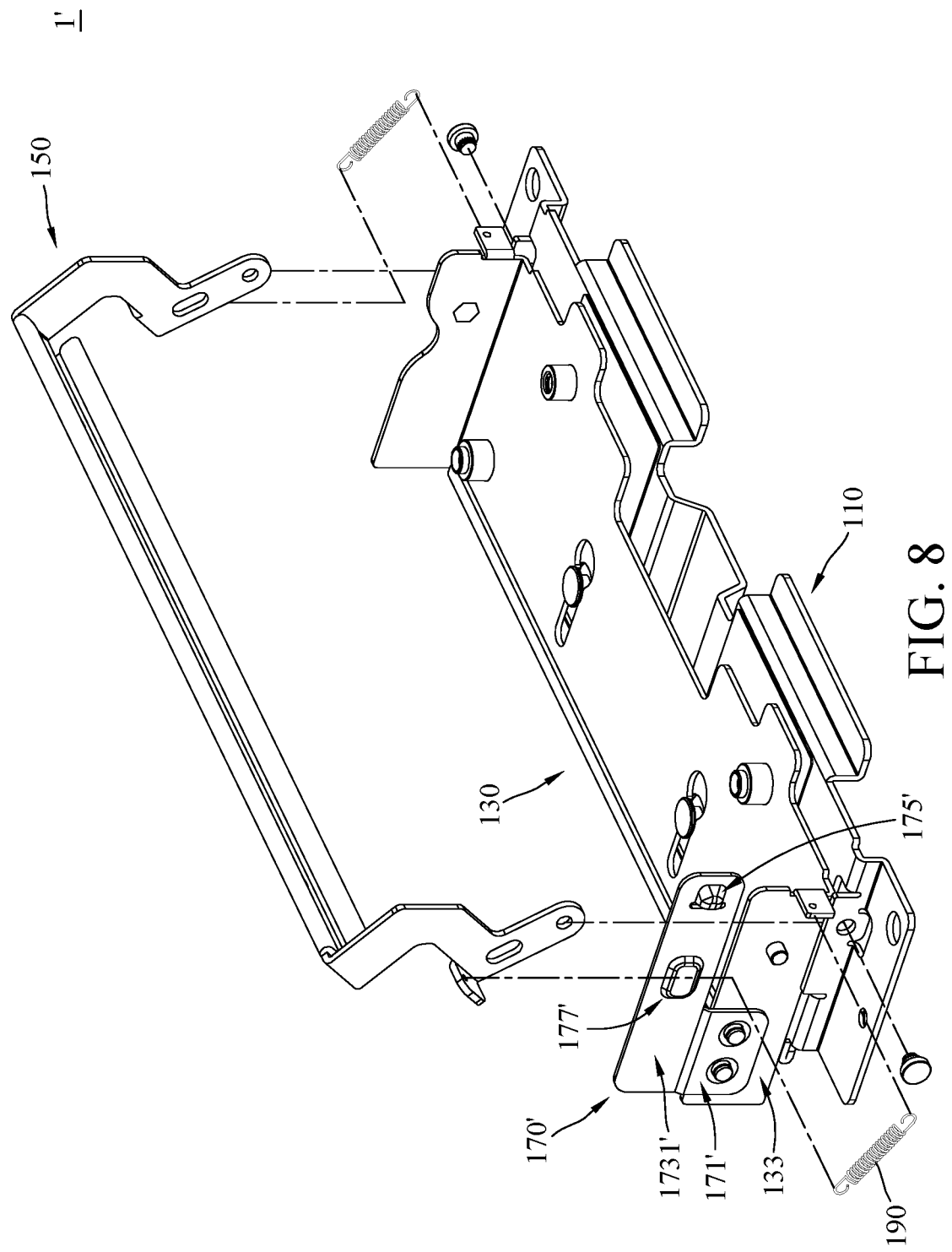
FIG. 8 is an exploded perspective view of a mount assembly for add-in card according to another embodiment of the disclosure.

The above is one of the exemplary embodiments of the disclosure, and the disclosure is not limited thereto. Please refer to FIG. 8, where FIG. 8 provides a mount assembly 1' according to another embodiment of the disclosure that is suitable for switching status within a narrow space between the back panel 6 and the second cage 72 to engage the add-in card 9 to the back panel 6 or to disengage the add-in card 9 from the back panel 6. Note that one of the main differences between the mount assembly 1' of this embodiment and the mount assembly 1 of the previous embodiments is the design of the positioning structure, thus the same or similar features of these embodiments may be omitted from the drawings and will not be described repeatedly, and only their differences will be described hereinafter.

In this embodiment, the mount assembly 1' may include at least one positioning structure 170'. The positioning structure 170' may be, but is not limited to made of a single piece. In more detail, the positioning structure 170' may be, for example, but not limited to made of metal or any other suitable materials having resilience and elasticity and thus capable of springing back to its original shape. More specifically, the positioning structure 170' includes a fixed portion 171', an elastic connection portion 1731', a stopper portion 175' and an actuating portion 177'. The fixed portion 171' may be fixed to the outer sides of the side plate 133 of the tray 130 via, for example, screw, adhesive or any other suitable manners. The elastic connection portion 1731' is resilient and elastic and is connected to a side of the fixed portion 171' so as to be located above the side plate 133; that is, the elastic connection portion 1731' is located above the side plate 133 via the fixed portion 171'. The stopper portion 175' is located at one end of the elastic connection portion 1731' away from the fixed portion 171'. The actuating portion 177' is located closer to the fixed portion 171' than the stopper portion 175'. Similarly, when a certain amount of external force is applied on the elastic connection portion 1731', the elastic connection portion 1731' can be bent with respect to the fixed portion 171', and the stopper portion 175' is also moved with respect to the fixed portion 171'. In this embodiment, the stopper portion 175' is, for example, but not limited to a bump protruding outward from the surface of the elastic connection portion 1731'. The actuating portion 177' may be also a bump protruding outward from the surface of the elastic connection portion 1731'. However, the disclosure is not limited to the shapes of the stopper portion 175' and the actuating portion 177'.

Figure 9:
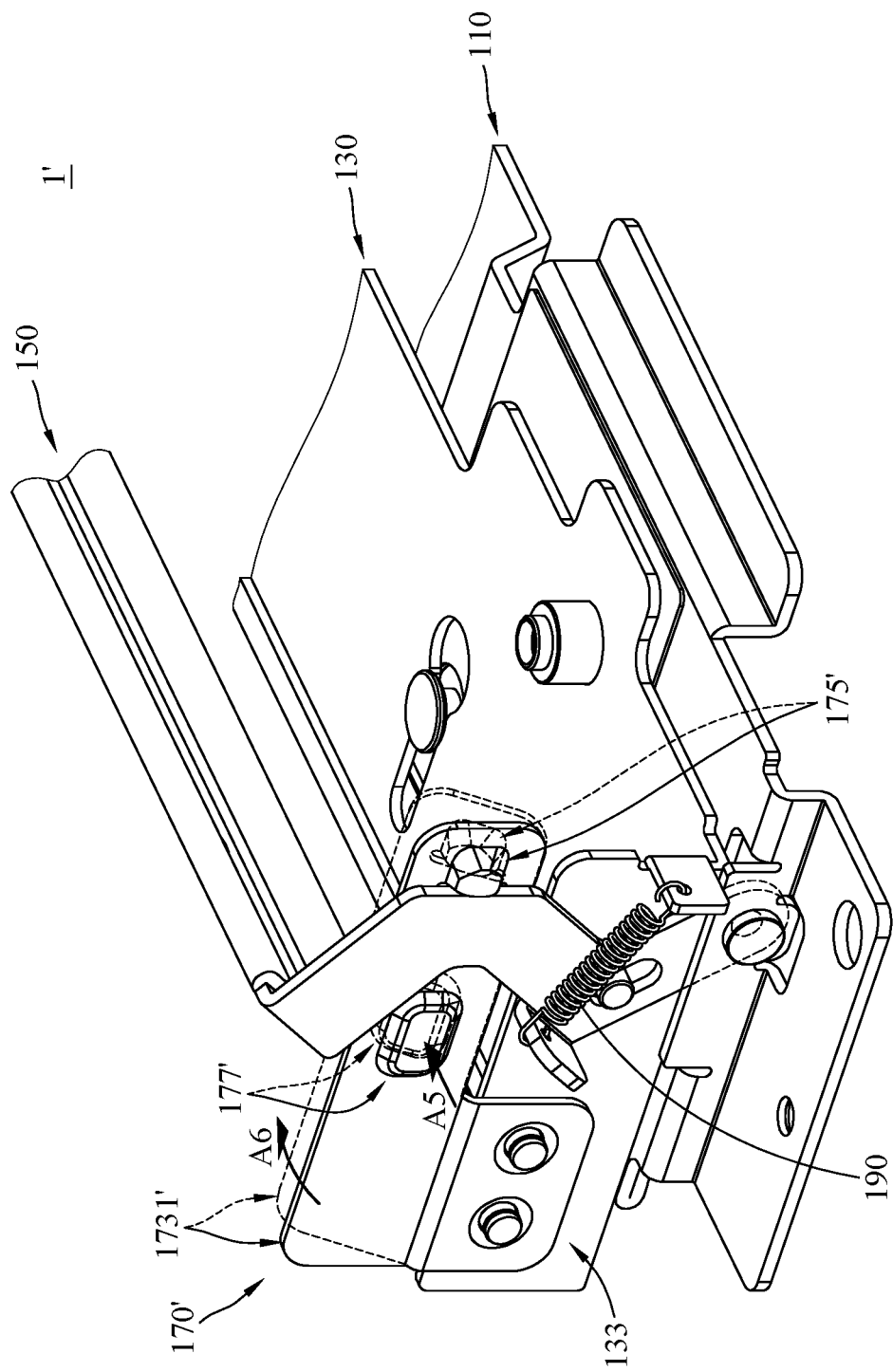
FIG. 9 is a partial perspective view of the mount assembly in FIG. 8 when the mount assembly is in the disconnected status.
Figure 10:
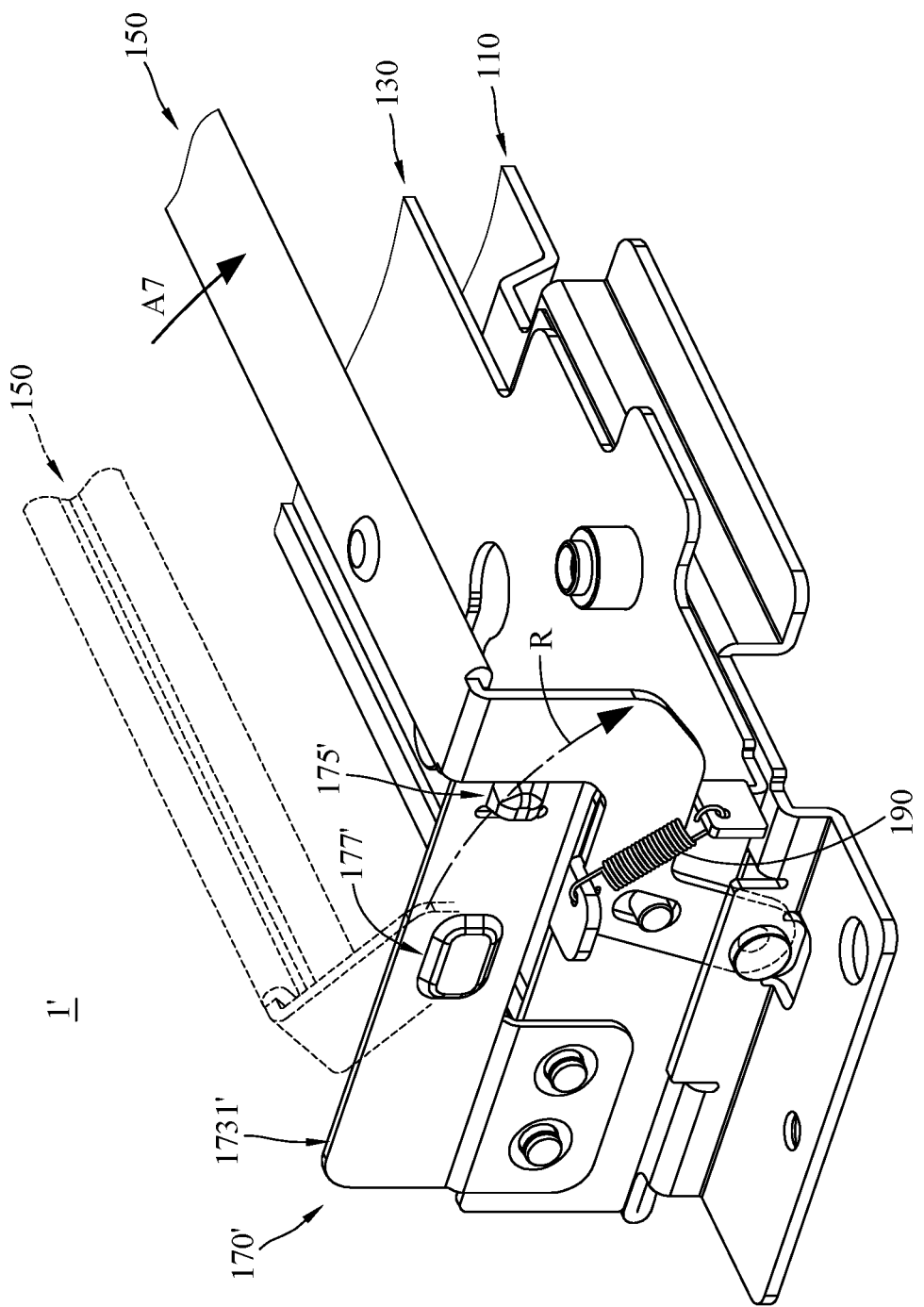
FIG. 10 is a partial perspective view of the mount assembly in FIG. 8 when the mount assembly is in the connected status.

Then, referring to FIGS. 9-10, where FIG. 9 is a partial perspective view of the mount assembly 1' when the mount assembly 1' is in the disconnected status, and FIG. 10 is a partial perspective view of the mount assembly 1' in FIG. 8 when the mount assembly 1' is in the connected status. Firstly, as the solid line shown in FIG. 9, the handle 150 is in the opened position, since the stopper portion 175' of the positioning structure 170' is located on the pivoting path R of the handle 150, the handle 150 is stopped at the opened position by the stopper portion 175' and not allowed to move to the closed position, and the elastic biasing component 190 is stretched by the handle 150 and the tray 130 and thus storing elastic potential energy. Then, as the dotted line shown in FIG. 9, the actuating portion 177' of the positioning structure 170' is forced to move in, for example, a direction indicated by arrow A5 so that the elastic connection portion 1731' of the positioning structure 170' is bent with respect to the side plate 133 of the tray 130 in, for example, a direction indicated by arrow A6, causing the stopper portion 175' to leave the pivoting path R of the handle 150.

At this moment, as shown in FIG. 10, the elastic potential energy stored in the elastic biasing component 190 is released to force the handle 150 to move toward the closed position along the pivoting path R in, for example, a direction indicated by arrow A7, causing the mount assembly 1' to switch to the connected status.

Figure 11:
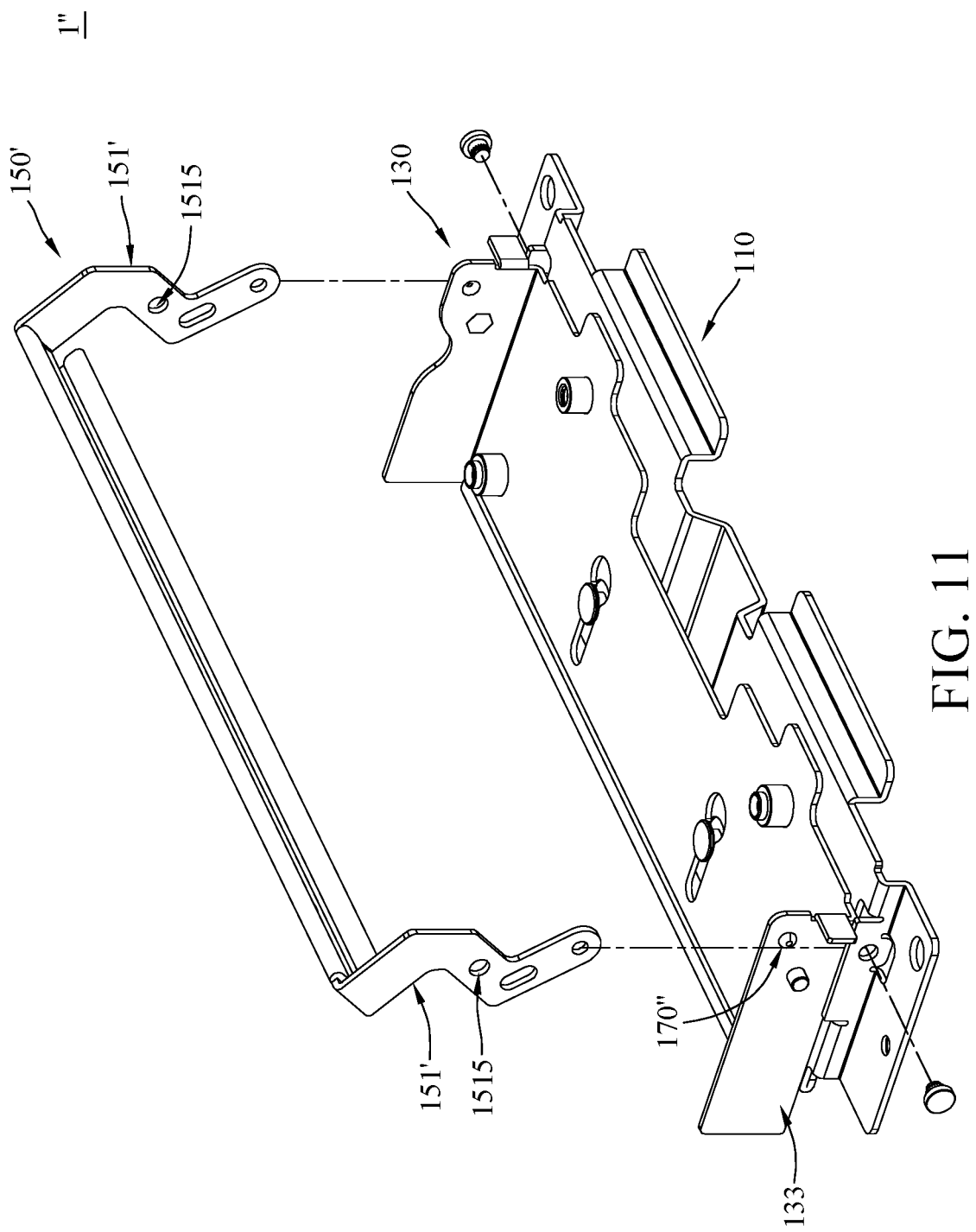
FIG. 11 is an exploded perspective view of a mount assembly for add-in card according to still another embodiment of the disclosure.

Alternatively, referring to FIG. 11, where FIG. 11 provides a mount assembly 1" according to still another embodiment of the disclosure that is also suitable for switching status within a narrow space between the back panel 6 and the second cage 72 to engage the add-in card 9 to the back panel 6 or to disengage the add-in card 9 from the back panel 6. Note that one of the same or similar features of this and the previous embodiments may be omitted from the drawings and will not be described repeatedly, and only their differences will be described hereinafter.

In this embodiment, the mount assembly 1" includes a handle 150' and at least one positioning structure 170". At least one of the arm parts 151' of the handle 150' has a positioning hole 1515, and at least one positioning structure 170" is disposed on one of the side plates 133 of the tray 130. In this embodiment, the positioning structure 170" is, for example, a protrusion structure on the side plate 133 of the tray 130, and the positioning hole 1515 is a through hole, concave or recessed portion mating the positioning structure 170".

Figure 12:
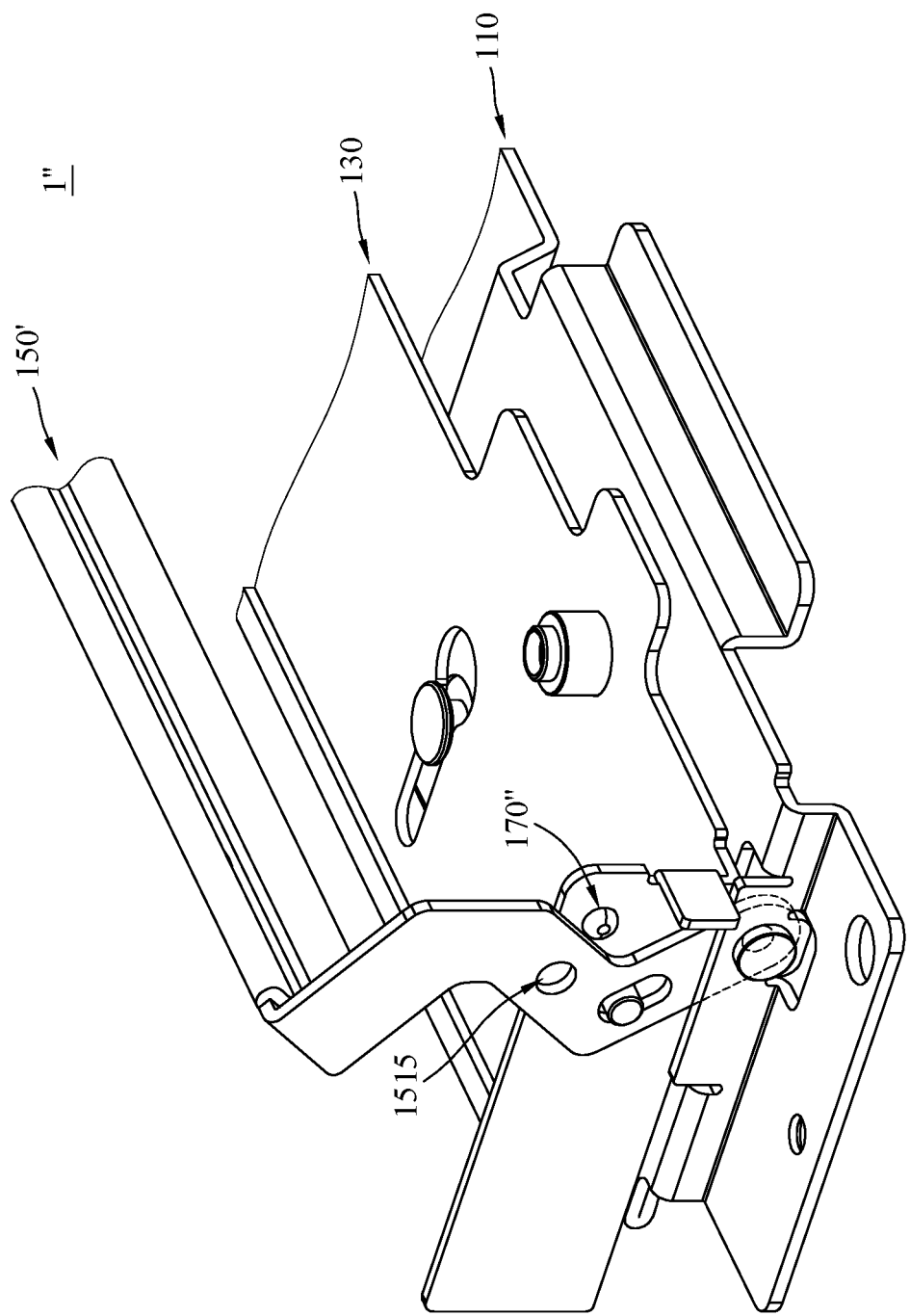
FIG. 12 is a partial perspective view of the mount assembly in FIG. 11 when the mount assembly is in the disconnected status.
Figure 13:
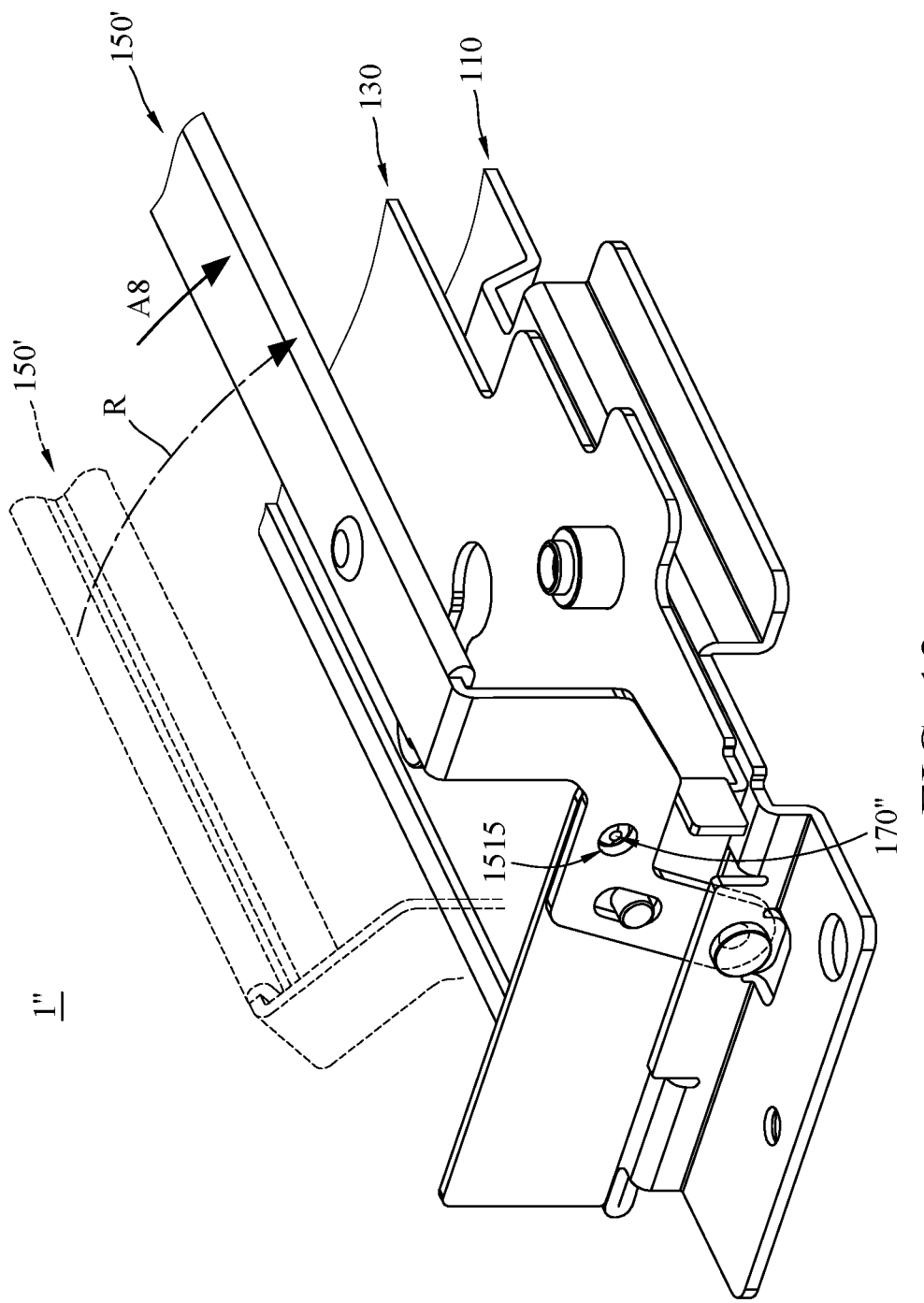
FIG. 13 is a partial perspective view of the mount assembly in FIG. 11 when the mount assembly is in the connected status.

Then, please refer to FIGS. 12-13, where FIG. 12 is a partial perspective view of the mount assembly 1" in FIG. 11 when the mount assembly 1" is in the disconnected status, and FIG. 13 is a partial perspective view of the mount assembly 1" in FIG. 11 when the mount assembly 1" is in the connected status. Firstly, as shown in FIG. 12, the handle 150' is in the opened position, since the positioning structure 170" is located on the pivoting path R of the handle 150', the handle 150' is stopped at the opened position by the positioning structure 170". Then, as shown in FIG. 13, the handle 150' is forced to move toward the closed position along the pivoting path R in, for example, a direction indicated by arrow A8, and the handle 150' will press and push the positioning structure 170" so as to force the side plate 133' of the tray 130' to slightly bend, such that the handle 150' is able to slide across the positioning structure 170" and move to the closed position, thereby switching the mount assembly 1" to the connected status.

Further, in some other embodiments, the positioning structure and/or the elastic biasing component in the previous embodiments may be omitted from the mount assembly; in such a case, the handle can be kept in the opened position by manually holding the handle, and the position switching of the handle can also be implemented in a manual manner. Regarding the handle of the disclosure, in some embodiments, the handle may only have a single arm part; in such a case, the connection mechanism for connecting the handle, the tray and the base plate at one side of the mount assembly remains.

According to the mount assembly for add-in card and the electronic device having the same and the chassis for the electronic device as discussed in the previous embodiments of the disclosure, since the handle is pivotally connected to the base plate via the pivot portion, and the handle is pivotally and slidably disposed on the tray via the tray installation portion, the pivoting motion of the handle can be transferred to the sliding motion of the tray with respect to the base plate. When the add-in card is installed on the tray of the mount assembly, the add-in card on the tray can be moved back and forward by pivoting the handle. Therefore, in some applications that the mount assembly is used in an electronic device, such as a server, the mount assembly is able to move the add-in card in a very limited and narrow space, thereby facilitating the installation/removal of the add-in card.

In addition, in some embodiments, the mount assembly has the elastic biasing component for automatically returning the handle to the closed position and constantly forcing the mount assembly to switch to connected status, which not only makes the mount assembly easy to use but also improves and secures the electrical connection between the add-in card and the back panel, thereby ensuring that the add-in card is kept in the electrically connected status. In some other embodiments that the mount assembly does not have any elastic biasing component, the mount assembly can be operated by manually operating the handle to achieve the purpose of installing or removing the add-in card.

Further, in some embodiments, the mount assembly further has a positioning structure, and the positioning structure with the cooperation of the elastic biasing component is able to keep the handle in the opened position so as to keep the mount assembly in the disconnected status. As such, the user is allowed to take the mount assembly out of the server by holding the handle, and the tray does not move with respect to the handle during the process, ensuring the fluency of the maintenance process. Moreover, the user is able to release the handle and do other works while the add-in card still remains in not electrically connected status.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A mount assembly for add-in card, comprising:
a base plate;
a tray, slidably disposed on the base plate; and
a handle, comprising a pivot portion and a tray installation portion, wherein the pivot portion is pivotally disposed on the base plate, and the tray installation portion is pivotally and slidably disposed on the tray;
an elastic member connected to and exerting force on the tray and the handle;
a positioning structure comprising a stopper portion and an elastic connection portion connected to each other, wherein the stopper portion is movably disposed on the tray via the elastic connection potion, and the stopper portion has a flat surface configured to be engaged with a step on an upper edge of the base plate;
wherein the elastic member is configured to force the handle to pivot with respect to the tray and the base plate so as to cause the stopper portion to engage with the step of the base plate or to slide along the upper edge of the base plate.

2. The mount assembly according to claim 1, further comprising an elastic biasing component connected to the handle and the tray and configured to force the handle to move relative to the base plate and the tray.

3. The mount assembly according to claim 1, wherein the base plate comprises a main body part and a sidewall part, the tray is slidably disposed on the main body part, the sidewall part protrudes from the main body part and has the step, a side of the sidewall part located away from the main body part has the upper edge, the stopper portion of the positioning structure is configured to removably contact the step or slide on the upper edge of the sidewall part.

4. The mount assembly according to claim 3, wherein the positioning structure further comprises a middle portion and an actuating portion, and the stopper portion and the actuating portion respectively protrude from two opposite sides of the middle portion and are connected to the elastic connection portion via the middle portion.

5. The mount assembly according to claim 4, wherein the positioning structure further comprises a stopper structure fixed on the tray and located above a side of the middle portion on which the actuating portion is protruding from.

6. The mount assembly according to claim 1, wherein the handle is pivotable between an opened position and a closed position along a pivoting path with respect to the base plate, the stopper portion is at the pivoting path so that the stopper portion presses against and stops the handle at the opened position so as to prevent the handle from pivoting toward the closed position.

7. The mount assembly according to claim 1, wherein the tray comprises a handle installation portion, one of the handle installation portion of the tray and the tray installation portion of the handle is a sliding slot, the other one of the handle installation portion of the tray and the tray installation portion of the handle is a protrusion, and the protrusion is slidably and pivotally located in the sliding slot.

8. The mount assembly according to claim 1, wherein the base plate has at least one first guide structure, the tray has at least one second guide structure, one of the at least one first guide structure and the at least one second guide structure is a sliding slot, the other one of the at least one first guide structure and the at least one second guide structure is a positioning pin, the sliding slot comprises a first portion and a second portion connected to each other, the positioning pin comprises a neck portion and a head portion connected to each other, the neck portion is slidably located in the second portion, and an outer diameter of the head portion is larger than an outer diameter of the neck portion and a width of the second portion and is smaller than a width of the first portion.

9. The mount assembly according to claim 1, wherein the handle comprises a grip part and at least one arm part, the pivot portion and the tray installation portion are located on the at least one arm part, and the grip part is movably located on the tray via the arm part.

10. The mount assembly according to claim 1, further comprising at least one spacer located between the base plate and the tray.

11. A mount assembly for add-in card, comprising:
a base plate;
a tray, slidably disposed on the base plate; and
a handle, comprising a pivot portion and a tray installation portion, wherein the pivot portion is pivotally disposed on the base plate, and the tray installation portion is pivotally and slidably disposed on the tray;
a positioning structure being fixed on the tray and slidable along an upper edge of the base plate, wherein the positioning structure comprises a stopper portion and an elastic connection portion connected to each other, the stopper portion is movably disposed on the tray via the elastic connection potion;
wherein the stopper portion is slidable along the upper edge of the base plate so as to be removably engaged with a step on the upper edge or in slidable contact with the upper edge.

12. The mount assembly according to claim 11, further comprising an elastic biasing component connected to the handle and the tray and configured to force the handle to move relative to the base plate and the tray.

13. The mount assembly according to claim 11, wherein the base plate comprises a main body part and a sidewall part, the tray is slidably disposed on the main body part, the sidewall part protrudes from the main body part and has the step, a side of the sidewall part located away from the main body part has the upper edge, the stopper portion of the positioning structure is configured to removably contact the step or slide on the upper edge of the sidewall part.

14. The mount assembly according to claim 13, wherein the positioning structure further comprises a middle portion and an actuating portion, and the stopper portion and the actuating portion respectively protrude from two opposite sides of the middle portion and are connected to the elastic connection portion via the middle portion.

15. The mount assembly according to claim 14, wherein the positioning structure further comprises a stopper structure fixed on the tray and located above a side of the middle portion on which the actuating portion is protruding from.

16. The mount assembly according to claim 11, wherein the handle is pivotable between an opened position and a closed position along a pivoting path with respect to the base plate, the stopper portion is at the pivoting path so that the stopper portion presses against and stops the handle at the opened position so as to prevent the handle from pivoting toward the closed position.

17. The mount assembly according to claim 11, wherein the tray comprises a handle installation portion, one of the handle installation portion of the tray and the tray installation portion of the handle is a sliding slot, the other one of the handle installation portion of the tray and the tray installation portion of the handle is a protrusion, and the protrusion is slidably and pivotally located in the sliding slot.

18. The mount assembly according to claim 11, wherein the base plate has at least one first guide structure, the tray has at least one second guide structure, one of the at least one first guide structure and the at least one second guide structure is a sliding slot, the other one of the at least one first guide structure and the at least one second guide structure is a positioning pin, the sliding slot comprises a first portion and a second portion connected to each other, the positioning pin comprises a neck portion and a head portion connected to each other, the neck portion is slidably located in the second portion, and an outer diameter of the head portion is larger than an outer diameter of the neck portion and a width of the second portion and is smaller than a width of the first portion.

19. The mount assembly according to claim 11, wherein the handle comprises a grip part and at least one arm part, the pivot portion and the tray installation portion are located on the at least one arm part, and the grip part is movably located on the tray via the arm part.

20. The mount assembly according to claim 11, further comprising at least one spacer located between the base plate and the tray.

\* \* \* \* \*